(12) United States Patent
Reichert et al.

(10) Patent No.: US 7,843,691 B2
(45) Date of Patent: Nov. 30, 2010

(54) TECHNIQUES FOR COOLING PORTABLE DEVICES

(75) Inventors: Armin Reichert, Stein (DE); Sven Stenzel, Erlangen (DE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 12/331,340

(22) Filed: Dec. 9, 2008

(65) Prior Publication Data

US 2009/0195983 A1 Aug. 6, 2009

Related U.S. Application Data

(60) Provisional application No. 61/025,850, filed on Feb. 4, 2008.

(30) Foreign Application Priority Data

Feb. 1, 2008 (EP) ................... 08001961

(51) Int. Cl.
  *H05K 7/20* (2006.01)
(52) U.S. Cl. .................. 361/695; 361/690; 361/692; 361/694; 174/16.1; 165/104.33
(58) Field of Classification Search ........................ None
  See application file for complete search history.

(56) References Cited

U.S. PATENT DOCUMENTS

| | | | |
|---|---|---|---|
| 5,285,350 A | | 2/1994 | Villaume |
| 5,694,294 A | * | 12/1997 | Ohashi et al. .......... 361/679.48 |
| 6,141,214 A | * | 10/2000 | Ahn ....................... 361/679.48 |
| 6,191,943 B1 | | 2/2001 | Tracy |
| 6,239,970 B1 | | 5/2001 | Nakai et al. |
| 6,430,042 B1 | * | 8/2002 | Ohashi et al. .......... 361/679.49 |
| 6,507,493 B2 | * | 1/2003 | Ueda et al. ................. 361/704 |
| 6,608,751 B2 | * | 8/2003 | Ishimine et al. ........ 361/679.55 |
| 6,822,856 B2 | * | 11/2004 | Fujiwara ................. 361/679.48 |
| 7,248,471 B2 | * | 7/2007 | Wabiszczewicz ........... 361/694 |
| 2005/0057899 A1 | | 3/2005 | Lord |

(Continued)

FOREIGN PATENT DOCUMENTS

EP    1 521 164 A2    4/2005

(Continued)

OTHER PUBLICATIONS

Solbrekken, G. et al., "Thermal management of portable electronic equipment using thermoelectric energy conversion" ITHERM 2004, The Ninth Intersociety Conference on Thermal and Thermomechanical Phenomena in Electronic Systems, IEEE, Jun. 1-4, 2004, vol. 1, pp. 276-283.

(Continued)

*Primary Examiner*—Boris L Chervinsky
(74) *Attorney, Agent, or Firm*—Potomac Patent Group PLLC

(57) ABSTRACT

The invention relates to cooling techniques for portable devices such as, for example, mobile telephones. In one implementation, a portable device comprises one or more printed circuit boards ("PCBs") supporting multiple heat-generating components, an airflow generator adapted to generate an airflow internally in the portable device, and a heat sink element thermally connected to the heat-generating components, wherein the heat sink element is adapted to receive heat from the heat-generating components for dissipation by the airflow.

22 Claims, 6 Drawing Sheets

U.S. PATENT DOCUMENTS

| | | |
|---|---|---|
| 2005/0061477 A1 | 3/2005 | Mira |
| 2006/0056151 A1 | 3/2006 | Hara et al. |
| 2006/0104025 A1 | 5/2006 | Wabiszczewicz |
| 2006/0120043 A1 | 6/2006 | Wolford et al. |
| 2007/0081307 A1 | 4/2007 | Shinotou et al. |
| 2007/0097628 A1 | 5/2007 | Pais |

FOREIGN PATENT DOCUMENTS

| | | |
|---|---|---|
| JP | 2007088535 A | 4/2007 |
| JP | 2007174469 A | 7/2007 |
| WO | 2004/103048 A2 | 11/2004 |

OTHER PUBLICATIONS

European Search Report, dated Jul. 22, 2008, in connection with European Patent Application No. EP 08 00 1961.

* cited by examiner

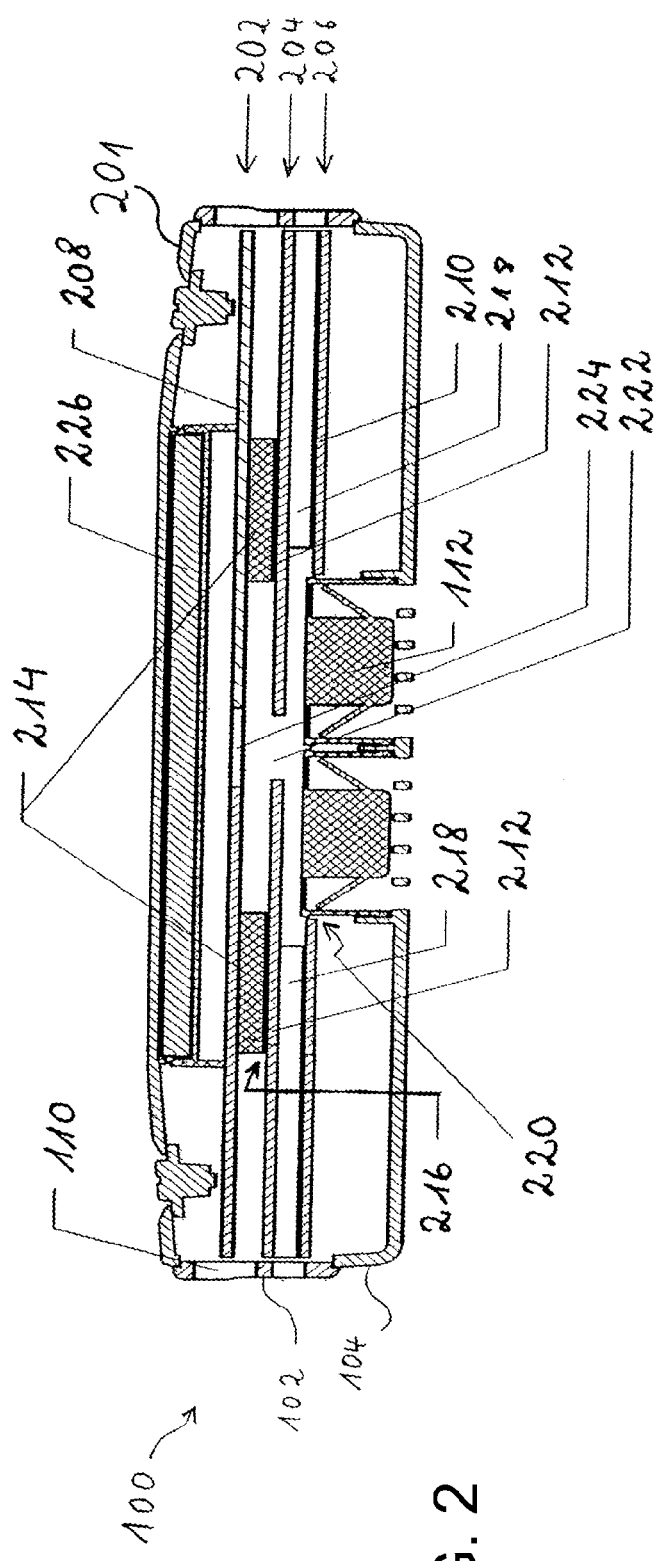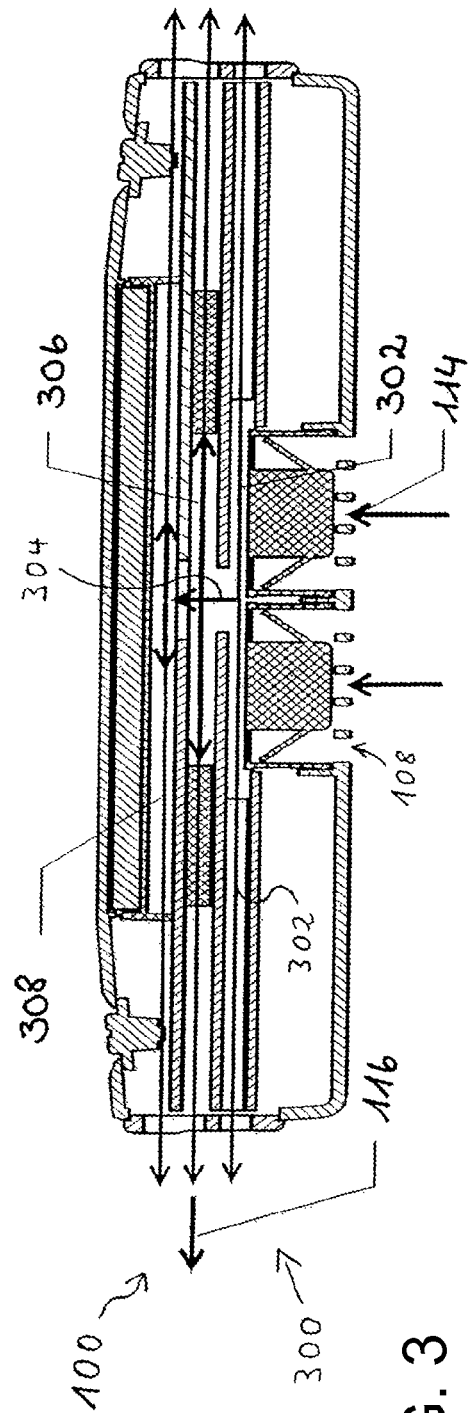
FIG. 2
FIG. 3

TECHNIQUES FOR COOLING PORTABLE DEVICES

CROSS-REFERENCE TO RELATED APPLICATIONS

This application claims priority under 35 U.S.C. §119 to European Patent Application No. 08001961.5, filed Feb. 1, 2008, which is hereby incorporated herein by reference in its entirety. This application also claims the benefit of U.S. Provisional Application No. 61/025,850, filed Feb. 4, 2008, which is hereby incorporated herein by reference in its entirety.

TECHNICAL FIELD

The invention relates to a cooling technique for portable devices such as, for example, mobile telephones. More specifically, the invention relates to internal cooling concepts for portable devices using air as a cooling medium.

BACKGROUND

Today, a large variety of electronic portable devices is available, for example mobile devices such as mobile telephones, personal navigation devices, but also (sub-) notebooks, ultra-mobile PCs, or peripheral devices for connection to a PC such as external network cards or external storage components. Handheld devices may be seen as a class of portable devices comprising, besides mobile telephones, also smartphones, wireless e-mail clients, personal digital assistants (PDAs), etc. In general, each of these portable devices comprises one or more printed circuit boards (PCBs), which may be arranged in one or more PCB layers extending parallel to each other to enable the typical, essentially flat or plane shape of many portable devices. Each PCB supports a plurality of electronic components generating substantial amount of heat, for example microprocessors, power supply components, FPGAs (Field Programmable Gate Arrays) and DSPs (Digital Signal Processors).

As a general trend, portable devices tend to contain more and more functionalities. The functionalities may comprise new, more and/or more complex applications. As an example, following the evolution of mobile network technologies, mobile devices are developed which transmit or receive data with increasingly higher data rates. With increasing complexity, generally also the power consumption of the portable devices increases. As the size of portable devices is essentially constant or even shrinking, the problem of cooling the devices becomes more and more important, i.e. the problem of keeping the temperature inside the device below a maximum allowed temperature.

For larger, stationary electronic devices, such as personal computers (PCs), various cooling mechanisms are conventionally applied. For example, heat sinks may be applied to PCBs or directly to particularly heat-generating electronic components such as microprocessors, ASICs (Application Specific Integrated Circuits) or transistors. Heat sinks, which may be made from metal with high thermal conductivity such as aluminium, are typically dimensioned as required for dissipating the thermal energy from the corresponding electronic components and may, for example, be massive components and/or comprise spacious ribs for efficient dissipation. Heat sinks may thus be much larger than the electronic components on a PCB, which generally is not problematic because there are no strict requirements on the dimensions of, for example, a PC housing. In other cases, if an overly large heat sink is required, this may be mounted to the outside of a stationary device, for example in the field of power electronics.

As a further cooling technique, a fluid such as ambient air may be used as a heat dissipating medium. In many cases in which passive air cooling is not sufficient, fans are used as airflow generators in order to generate an internal airflow which increases heat dissipation from components such as transformers or hard drives. In a typical configuration, a PC housing may comprise one or more holes acting as air inlets, one or more holes acting as air outlets and an internal fan adjacent to, e.g., the air outlet.

The cooling problem for portable devices cannot be solved by simply transferring the cooling concepts from PCs or other stationary devices. While there typically is enough space available in larger devices, for example for providing sufficiently large fans or heat sinks, portable devices are limited in internal space.

SUMMARY

There is a demand for efficient techniques for cooling portable devices.

This demand is satisfied by a first implementation of a portable device which comprises one or more printed circuit boards ("PCBs") supporting multiple heat-generating components; an airflow generator adapted to generate an airflow internally in the portable device; and a heat sink element thermally connected to the multiple heat-generating components, wherein the heat sink element is adapted to receive heat from the heat-generating components for dissipation by the airflow.

The portable device may, for example, be a mobile device such as a mobile telephone, PDA, or any other handheld device. In some realizations, the portable device may be a device in which the size and dimensions of the device limit the space internally available for the PCBs, electronic components carried by the PCBs, and further components such as cooling components. For example, such a device may be a notebook, but also a stationary electronic device such as a desktop personal computer. Additionally, or alternatively, the portable device may be a device in which the resources available for cooling are limited in terms of number and sizes of air inlets/outlets, airflow generators, heat sinks and in terms of available space for air flowing through the device.

The heat-generating components may be those electronic components which require a reasonable fraction of the total power consumption of the portable device in one or more operational states of the device. The "reasonable fraction" may be a fraction of the total power consumption which cannot be dissipated and which therefore may damage parts of the device in the absence of a particular cooling mechanism.

The airflow generator may comprise one or more fans. In some realizations of the portable device, two or more slow-turning fans may be provided in order to support one or more of the design of an essentially flat housing of the portable device, a larger air inlet simplifying the distribution of air inside the portable device and a larger air volume drawn into the device.

The heat sink element may receive heat from the heat-generating components in order to achieve at least one of conducting the heat towards an area or volume inside the portable device reached by the airflow and distributing the heat over a larger area or volume in order to enable an efficient dissipation by the airflow.

The heat sink element may be thermally connected to the multiple heat-generating components by thermal gap filler grease in order to account for dimensional tolerances of the heat sink element and the heat-generating components. Additionally, or alternatively, thermal pads and/or thermal adhesive may be used to connect the heat sink element with the multiple heat-generating components. Additionally or alternatively, the heat sink element may be screwed to one or more of the one or more PCBs supporting the heat-generating components.

The heat sink element may be an essentially flat element. For example, the heat sink element may have essentially the same dimensions as the one or more PCBs. In some realizations, the heat sink element may essentially span over at least 60 to 80% of the total area of the portable device.

The heat sink element may comprise ribs. These ribs may be provided for cooling purposes, but may also be adapted for directing the airflow along the heat sink element. The heat sink element may comprise an air passage adapted to enable passing of at least a first part of the airflow through the heat sink. Additionally or alternatively, at least one of the at least one PCBs may comprise an air passage adapted to enable passing of at least a second part of the airflow through the PCB.

An inflowing direction of the airflow into the portable device may be arranged perpendicular to a main area of the heat sink element. For example, in case the heat sink element is an essentially flat element arranged, the incoming airflow may impinge at least in part on the heat sink element. An outflowing direction of the airflow may be parallel to the main area of the heat sink element, such that a large area of the heat sink element is in contact with the airflow.

The heat sink element may be adapted to divert at least a third part of the airflow from a perpendicular to a parallel flow direction with regard to the main area of the heat sink element. For example, an air passage, if any, may allow only a small part of the airflow to pass through the heat sink element.

An air inlet, the airflow generator, the heat sink element and possibly further components of the portable device may be arranged such that an inflowing portion of the airflow directly flows to the heat sink element.

The above demand is further satisfied by a second implementation of a portable device which comprises a first printed circuit board ("PCB") layer comprising at least one PCB; and an airflow generator adapted to generate an internal airflow for cooling the portable device. The first PCB layer comprises an air passage adapted to enable passing of at least a fourth part of the airflow through the first PCB layer.

As for the first implementations, the portable device may be any device in which the size and dimensions of the device and/or the available cooling resources are limited Regarding the second implementations, the portable device may comprise multiple PCB layers. One or more of the PCB layers may comprise an air passage. For example, the portable device may comprise the first PCB layer and a second PCB layer each having an air passage. In another realization of the second implementation of the portable device, only the first PCB layer has an air passage, while the second PCB layer has not. In some variants, the air passages in the first and second PCB layer may be aligned with each other. Any of the two implementations of the portable device may comprise a housing with laterally arranged air outlets, which may be adapted to let the airflow leaving the portable device after flowing along the one or more PCB layers.

The airflow generator may comprise one or more fans. In one variant, the airflow generator may be located adjacent to an air inlet in a housing of the portable device. In another implementation, the airflow generator may be located adjacent to an air outlet in a housing of the portable device. The airflow generator may be provided adjacent to the air passage in the first PCB layer. In some variants of the portable device, the airflow generator may be located at a rearward side of the portable device, for example in case a temperature-sensitive component such as an LCD (Liquid Crystal Display) is arranged on the front side of the portable device.

The air passage in at least one of the first and the second PCB layer may comprise at least one of an opening in a PCB and a gap between two PCBs. The relation of the fourth part of the airflow relative to a fifth part of the airflow which not passes through the air passage may be adjusted, e.g., by the dimensions of the air passage. Strength and directions of the fourth and the fifth part of the airflow may, for example, also be configured by a shape of the air passage and/or deflecting elements.

The air passage may be adapted to enable flowing of at least a portion of the fourth part of the airflow along a first side of the first PCB layer and flowing of the fifth part of the airflow along an opposite side of the first PCB layer. Deflecting elements may be used to turn the direction of airflow from perpendicular to the PCB layer to a direction parallel to the PCB layer. The PCB layers, a heat sink layer, or other components of the portable device may be used for this purpose. Any of the variations described herein with regard to the air passage in the first PCB layer may also be applied to an air passage in the second and/or further PCB layer.

The air passage may be adapted such that at least a portion of the fourth part of the airflow impinges on at least one of a heat-generating component and a temperature-sensitive component after passing through the first and/or second PCB layer. The temperature-sensitive component may include a display component such as an LCD of the portable device. In this configuration, the airflow generator at a rearward side may be located directly behind the front-sided one or more heat-generating and/or temperature-sensitive component such that a part of the generated airflow may pass through one or more air passages in one or more PCB and/or heat sink layers directly to these components.

The airflow generator may be arranged in the air passage of at least one of the first and the second PCB layer. For example, the airflow generator may be arranged in the air passage of the second PCB layer, such that the airflow generated by the airflow generator passes through the air passage in the first PCB layer.

The portable device may comprise a heat sink layer extending substantially parallel to the first PCB layer, the heat sink layer comprising one or more heat sink members adapted to thermally connect with conductive pads or heat grease to one or more heat-generating components of the portable device. The one or more heat sink members may be made of a metal such as aluminium. In one variant of the portable device, the one or more heat sink members comprise ribs adapted to cool the heat generating components and to guide the airflow internally through the portable device.

The heat sink layer may comprise an air passage adapted to enable passing of at least a sixth part of the airflow through the heat sink layer. Any of the variations described herein with regard to the air passage(s) in the one or more PCB layers may also be applied to an air passage in the heat sink layer. In one mode, the air passage in the heat sink layer and the air passage in the first PCB layer may be aligned with each other.

The first and the second implementation of a portable device as discussed hereinbefore may or may not be combined in a single portable device. Any of the variants and realizations described with respect to one implementation may also be applied, insofar as technically possible, also to the other implementation.

The above-mentioned demand is further satisfied by a desktop stand adapted to receive the portable device according to any one of the preceding variants or implementations. The desktop stand is further adapted to provide a cooled airflow for internal cooling of the portable device and to direct the cooled airflow to an air inlet of the portable device.

In some implementations, the desktop stand comprises a cold sink adapted to provide cooled air for the cooled airflow and to direct the cooled airflow to the air inlet of the portable device. The cold sink may, for example, have a tubular shape.

The desktop stand may comprise a peltier element. The cold sink may thermally be connected to the cold side of the peltier element, while a hot sink may thermally be connected to the hot side of the peltier element. According to one variation, the desktop stand may further comprise a first airflow generator adapted to generate the cooled airflow and a second airflow generator adapted to generate an airflow for cooling the hot sink. The first airflow generator may have a larger capacity than an airflow generator in the portable device for cooling the portable device.

BRIEF DESCRIPTION OF THE DRAWINGS

In the following, the invention will further be described with reference to exemplary embodiments illustrated in the figures, in which:

FIG. 2 is a cross-sectional view of the mobile device of FIG. 1;

FIG. 3 schematically illustrates an airflow through the mobile device of FIG. 1 along the cross-sectional view of FIG. 2;

DETAILED DESCRIPTION OF PREFERRED EMBODIMENTS

In the following description, for purposes of explanation and not limitation, specific details are set forth, such as a specific mobile device, in order to provide a thorough understanding of the current invention. It will be apparent to one skilled in the art that the current invention may be practiced in other embodiments that depart from these specific aspects. For example, the skilled artisan will appreciate that the current invention may be practised with portable devices different from the mobile device described below to illustrate the present invention. This may include PDAs or handheld devices of any kind, but also other devices of similar size, e.g. navigators to be fixed to a console in a vehicle. This may also include any kind of notebook, ultra-mobile PCs, and in fact any electronic device, which has a given device size and shape due to some specific requirements, and in which heat from heat generating components cannot be easily dissipated.

Figure 1:
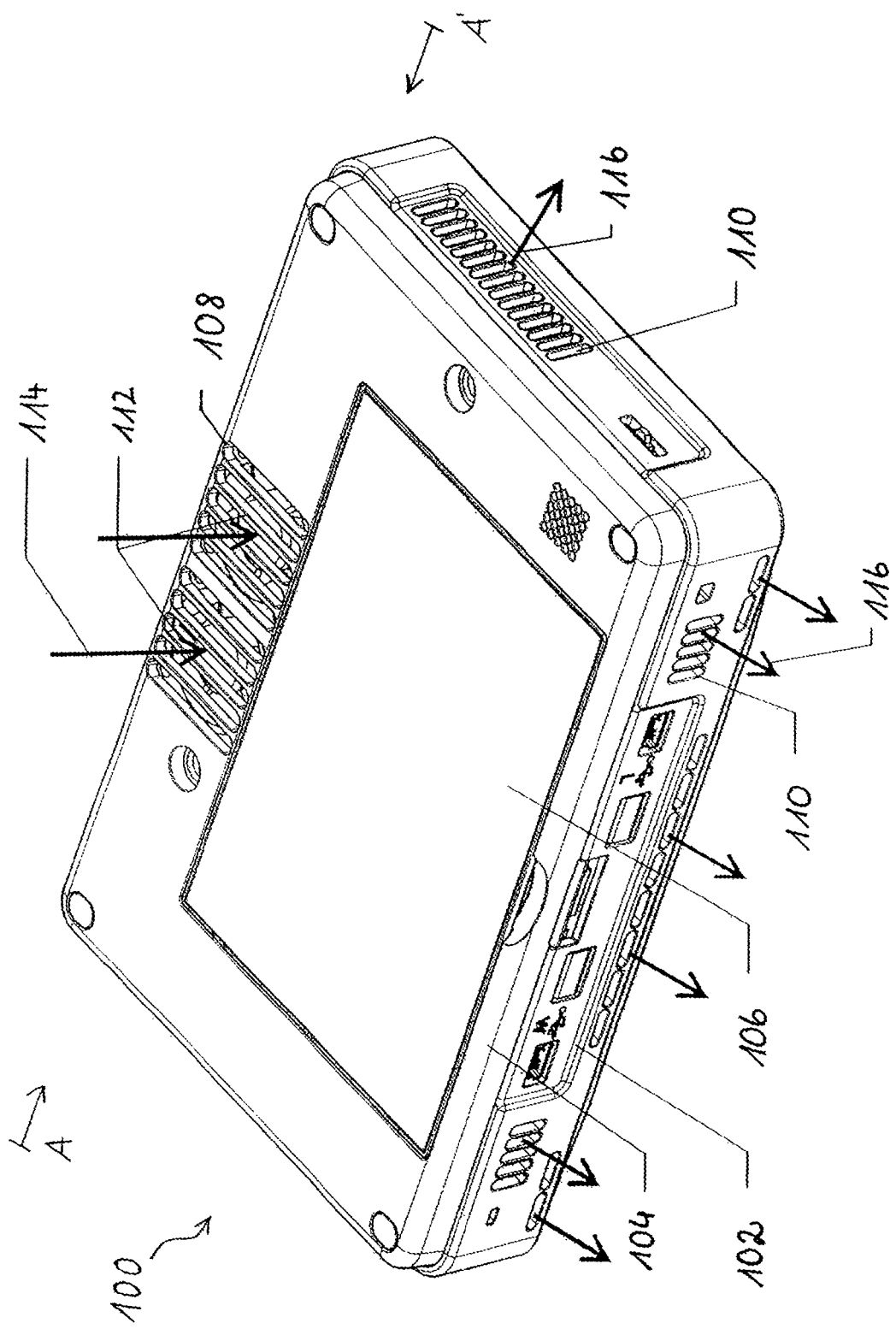
FIG. 1 is a perspective illustration of a mobile device as an embodiment of a portable device.

FIG. 1 schematically illustrates an exemplary implementation of a portable device 100. The portable device 100 may be adapted for communication with an UMTS or LTE mobile network. In this regard, the portable device 100 comprises powerful electronic components such as FPGAs shown in more detail in the following figures. Albeit small in size, during operation the device 100 may have a power consumption as high as 60 Watts. Without cooling, each of the FPGAs inside the device 100 may reach a temperature of up to 1500 Celsius. However, a maximum allowed temperature for the FPGA is typically 700 Celsius. Moreover, a display, such as an LCD (not shown in FIG. 1), of the device 100 may have a maximum temperature of only 65° Celsius. Without efficient cooling, the electronic components of the device 100 could be damaged during operation of the FPGA. A sophisticated cooling concept is thus required for the device 100, aspects of which will be described in detail in the following.

FIG. 1 shows the portable device 100 from the rearward side and comprising a frame housing 102 and a rear housing 104. Further shown is a battery case 106 arranged in the rear housing 104. Moreover, air inlets 108 are provided in the rear housing 104. The frame housing 102 comprises multiple lateral ventilation holes 110 acting as air outlets.

Behind the air inlets 108, two fans 112 are arranged which draw ambient air 114 into the portable device 100. The ambient air 114 is guided via multiple paths through the entire portable device 100, heats up and leaves the device 100 as heated up air 116 via the plurality of ventilation holes 110. The path of the air from the air inlets 108 to the air outlets 110 will be illustrated in detail in the following figures. Generally, in the figures the airflow into, through and out of the portable device 100 is indicated by arrows such as arrows 112 and 114.

FIG. 2 illustrates a cross section of the portable device 100 along the line A-A' indicated in FIG. 1. The layered construction of device 100 comprises, embraced within a front cover 201, frame housing 102 and rear housing 104, a first PCB layer 202, a heat sink layer 204, and a second PCB layer 206. Layers 202, 204, and 206 extend substantially parallel to each other. In particular, the heat sink layer essentially forms an additional, substantially flat layer with dimensions comparable to the PCB layers. The PCB layers 202 and 206 each comprise a single PCB 208 and 210, respectively, and the heat sink layer 204 is formed by a single heat sink element, namely a heat sink plate 212, as will be illustrated in more detail in FIG. 4.

From the various electronic components mounted on a PCB, typically few of these generate a major fraction of the heat to be dissipated, for example FPGAs or DSPs. The PCB 208 is illustrated in FIG. 2 to support some of these particularly heat-generating components 214. The heat sink plate 212 is arranged in the device 100 in order to directly contact the heat-generating components 214 such that the heat may be efficiently dissipated from the heat-generating components 214 to the internal airflow 300 and out of the device 100. Thermal heat grease 216 is used to optimize the thermal contact between the components 214 and the heat sink plate 212. The heat sink plate 212 is pressed on the heat-generating components 214 and may be screwed to the PCB 208 of the first PCB layer 206, thus assuring a reliable thermal contact between the heat-generating elements 214 and the heat sink element 212. The heat sink plate 212 comprise heat sink ribs 218. At the front side of portable device 100, an LCD 226 is arranged.

The two fans 112 are arranged adjacent to the air inlets 108 and extending through an opening 220 in the second PCB layer 206 (PCB 210). The heat sink layer 204 comprises an opening 222 and the PCB layer 202 comprises an opening 224. The openings 220, 222, and 224 act as air passages for the air drawn by the fans 112 into the device 100, as will be described next.

FIG. 3 illustrates an airflow 300 through the portable device 100 of FIG. 1. In FIG. 3, the cross-sectional view of FIG. 2 is repeated, i.e. FIGS. 2 and 3 show the identical elements of the portable device 100; however, for the sake of illustration, reference numerals for most of the elements have been omitted in FIG. 3. Therefore, for the following description FIGS. 2 and 3 should be taken together.

Ambient air 114 (cf. FIG. 1) flows as airflow 300 via the air inlets 108 and fans 112 into the device 100. A part 302 of the airflow 300 blown into the device 100 by the fans 112 impinges on the heat sink plate 212 and is diverted to flow along the PCB 210 as well as along the lower side of the heat sink plate 212 and the ribs 218 thereof. Another part 304 of the airflow 300 passes through air passage or opening 222 in the heat sink plate 212. From the airflow 304, a part 306 impinges on PCB 208 and is diverted to flow along the upper side of the heat sink plate 212 and the lower side of PCB 208, onto which the heat-generating components 214 are mounted, in a lateral direction. Another part 308 of airflow 304 passes through the air passage or opening 224 in PCB 208 and impinges on the LCD 226, which is a particularly temperature-sensitive component. The airflow 308 flows along the upper side of PCB 208 and along the LCD 226 in lateral direction. The laterally flowing parts 302, 306 and 308 of airflow 300 leave the portable device 100 via the lateral ventilation holes 110 (cf. FIG. 1)

As illustrated in FIGS. 2 and 3, the heat sink plate 121 receives thermal energy from the heat-generating components 214 and provides for that this thermal energy can efficiently be dissipated by airflow 300. For example, the cool part 302 of airflow 300 directly impinges on that portion of the heat sink plate 212 around the air passage 222 and dissipates therefrom heat originating from the components 214. Further, the large surface areas of the heat sink plate 212 extending through the entire device 100 and comprising the ribs 218 further act to efficiently dissipate the thermal energy from the heat generating components 212 to the parts 302 and 306 of airflow 300.

The fans 112, opening 222 in the heat sink plate 212 and opening 224 in the PCB 208 are aligned with each other. In this way, the fans 112 on the rear side of the device 100 blow a part of the ambient air 114 to both the lower and upper side of the heat sink layer 206, to both the lower and upper side of the PCB layer 202, and to the LCD 226. The opening 222 and 224 act as air channels and enable that ambient air is led over the PCBs and through the entire device 100; in this way, the airflow 300 reaches and cools the entire inside of the portable device 100. The PCB 208 is cooled from both sides and acts itself as a heat sink and cools the components mounted thereon. The temperature-sensitive LCD 226 is also directly cooled by the part 308 of the airflow 300 passing through the openings 222 and 224. The openings 222 and 224 allow enlarging the cooling surfaces without increasing the overall air resistance for the fans 112.

Figure 4:
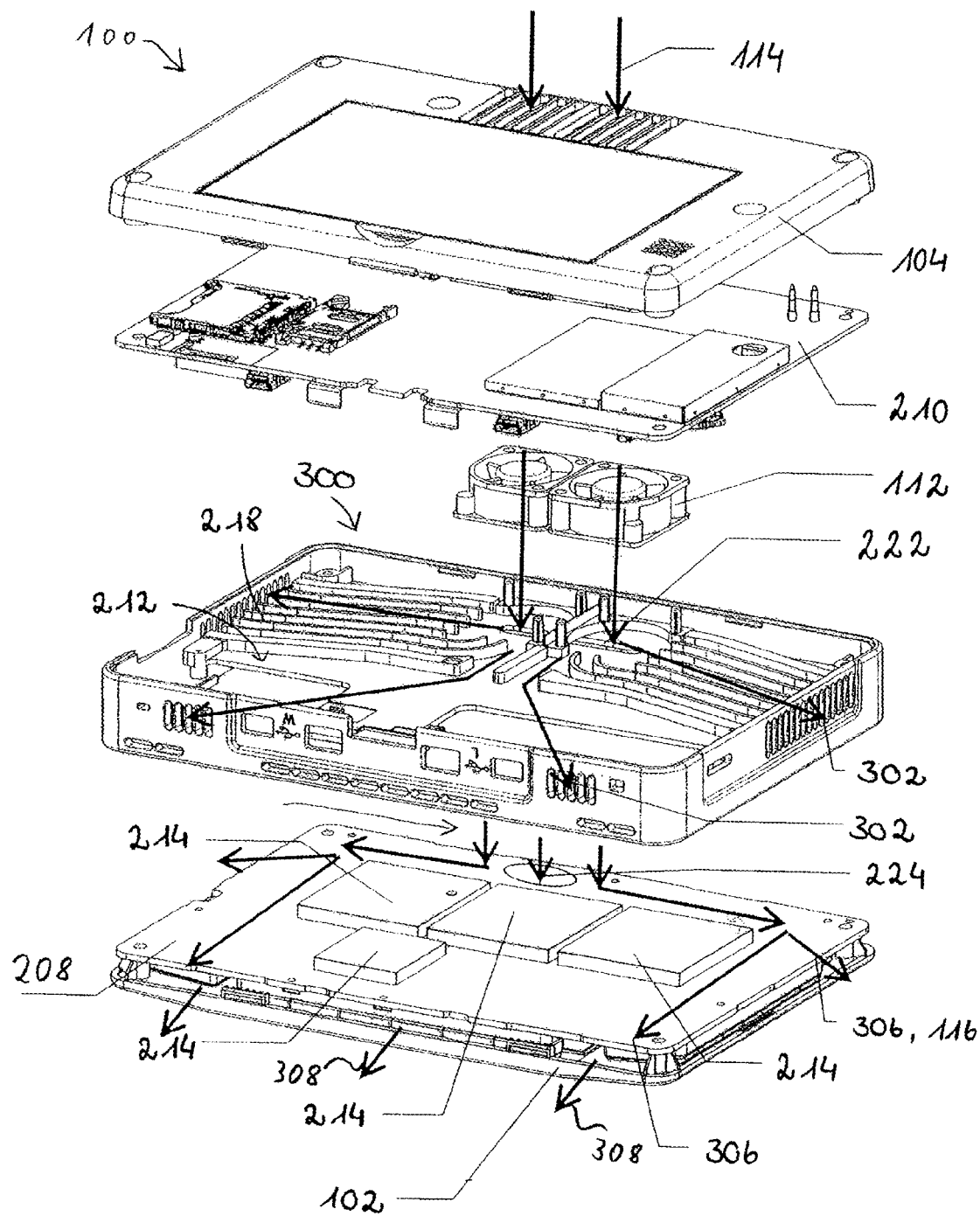
FIG. 4 is an exploded view of the mobile device of FIG. 1 schematically illustrating an airflow therethrough.

FIG. 4 illustrates the airflow 300 through portable device 100 in a perspective view. The airflow 300 passes through PCB 210 via the fans 112 mounted therein. At the heat sink plate 212, the part 302 of the airflow 300 is guided by the ribs 218 of the heat sink plate 212 to the lateral ventilation holes 110 in the frame housing 102. The ribs 218 are arranged to guide the airflow 302 over a large area of the heat sink plate 212 and in particular over those portions of the heat sink plate near to the heat-generating components 214 in contact with the other side of the heat sink plate 212. In this way, thermal energy is effectively dissipated from the components 214.

The part 304 of airflow 300 passing through the opening 222 in heat sink plate 212 impinges partly (306) on the PCB 208 and flows along the heat generating components 214 to the lateral ventilation holes 110 in housing 102. The portable device 100 is shown in FIG. 4 to comprise three FPGAs and one DSP as components 214 which exhibit a particular high power consumption in specific operational modes. As an example, from a total power consumption of the portable device 100 of 60 Watts, up to 40 Watts may be consumed by some or all of the components 214. Therefore, the components 214 are directly thermally connected via the thermal gap filler grease 216 to the heat sink plate 212. The thermal gap filler grease may be used to handle the component height tolerances and tolerances during a solder process, thus allowing to efficiently and reliably provide the thermal contact of the multiple heat-generating components 214 comprising one or more FPGAs, DSPs, or similar components to the single heat sink plate 212. Providing the single element 212 instead of multiple separated heat sink further increases heat dissipation efficiency. The airflows 306 and 308 are directed to flow along both sides of the PCB 208.

The other electronic components consuming the remaining 20 Watt of the total power consumption are also effectively cooled by the airflows 306 and 308, as well as by the airflow 302 flowing along the PCB 210. The airflow 308 flowing through the opening 224 to the LCD 226 at the front of the portable device 100 is coming directly from the air inlets 108 and therefore acts to efficiently cool the LCD 226.

Generally, the relative portioning of the airflow passing through the PCB layer(s) and/or heat sink layer(s) can be adjusted by size and shape of the air passages (air channels, openings) provided in these layers, as well as relative alignment of an air passage with airflow generator/air inlet and relative alignment of multiple air passages with each other. In the example illustrated in FIG. 4, the opening 222 in the heat sink plate 212 is designed as a narrow slit (compared to the dimensions of air inlet 108 and fans 112), such that most of the ambient air 114 is diverted by heat sink plate 212 to flow along the ribs 218 and only the smaller part 304 of the ambient air 114 passes on through the heat sink plate 212 to the PCB 208. Nevertheless, due to the alignment of fans 112 and openings 222 and 224 there is a direct flow from the air inlet 108 to the LCD 226 through the two PCB layers 202 and 206 and the heat sink layer 204, which leads to an efficient cooling of the LCD.

While the portable device 100 comprises two fans, other embodiments of portable devices may comprise a single fan only or may comprise a higher number of fans or other airflow generators. Similarly, while the portable device 100 comprises a single heat sink plate 212 forming one heat sink layer, in other devices one or more heat sink layers may be provided and designed differently, e.g. the number and design of ribs of a heat sink plate may be optimized for the specific cooling requirements in the device. The cooling concept as described with respect to the portable device 100 with two PCB layers and one heat sink layer may be adapted to other devices with a different number of PCBs and/or heat sink layers.

Figure 5A:
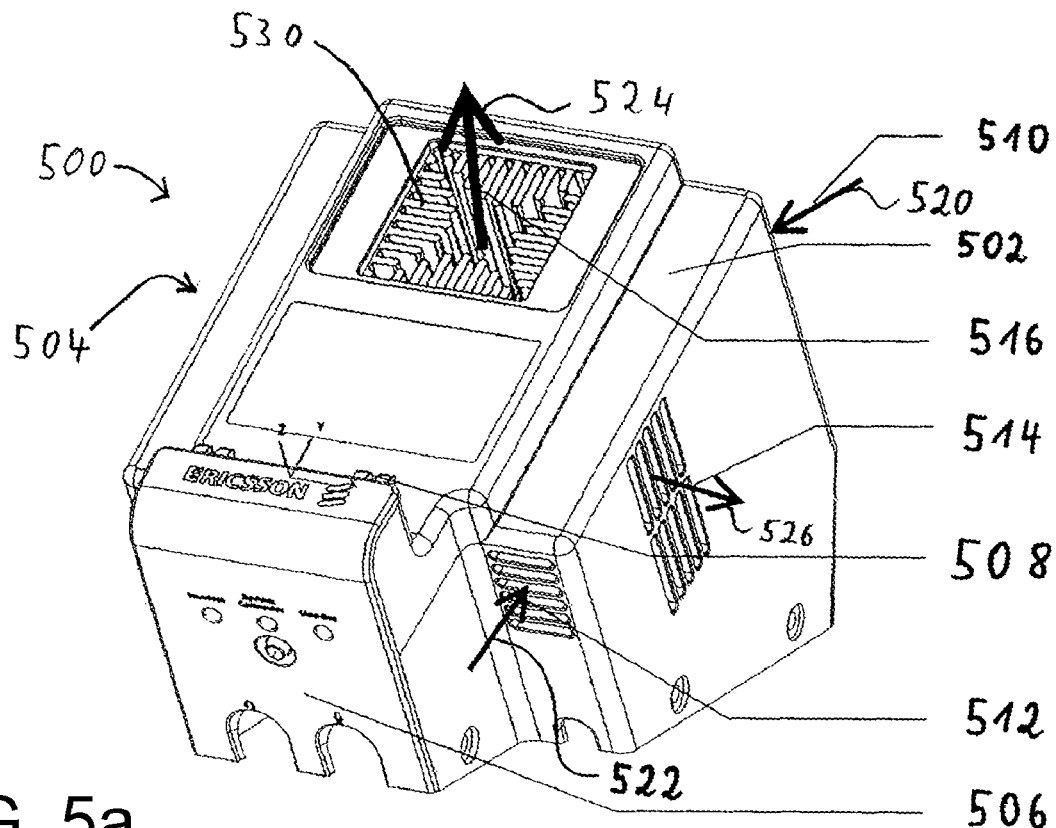
FIGS. 5a, 5b are a perspective and side view, respectively, of an embodiment of a desktop stand for the mobile device of FIGS. 1-4.
Figure 5B:
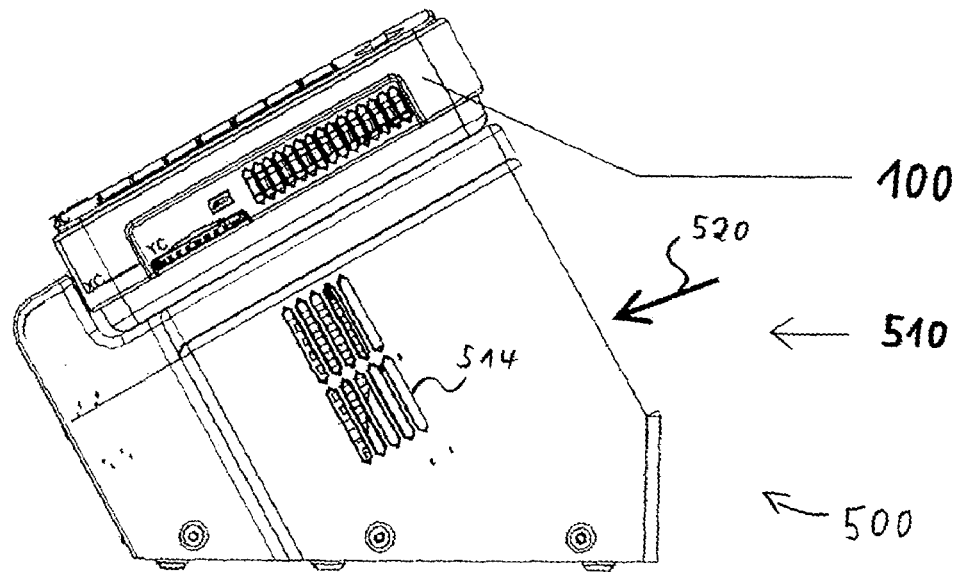

FIGS. 5a and 5b provide a perspective and a side view, respectively, of an embodiment of a desktop stand 500 for stationary usage of the portable device 100 from the foregoing figures. The desktop stand 500 enables further cooling of the portable device 100 by providing a cooled airflow for the internal cooling of the device 100 and directing the cooled airflow to the air inlet 108 of the portable device 100.

The desktop stand 500 comprises a housing 502 with a recess 504 for receiving the portable device 100, and a front cover 506. In the recess 504, connectors 508, such as power connectors etc., are provided for connecting to the portable device 100. The housing 502 has air inlets 510 and 512, respectively, for letting in ambient air, an air outlet 514. The reception member 504 comprises a cooled air outlet 516. Ambient airflows 520 and 522 enter the desktop stand 500 via air inlets 510 and 512, respectively. A cooled airflow 524 leaves the desktop stand 500 via air outlet 516. The portable device 100 as received by the reception member 504 is depicted only in FIG. 5b in order to clearly illustrate the air outlet 516 for the cooled airflow 524 in FIG. 5a. A hot airflow 526 leaves the desktop stand 500 via the outlet 514.

Figure 6:
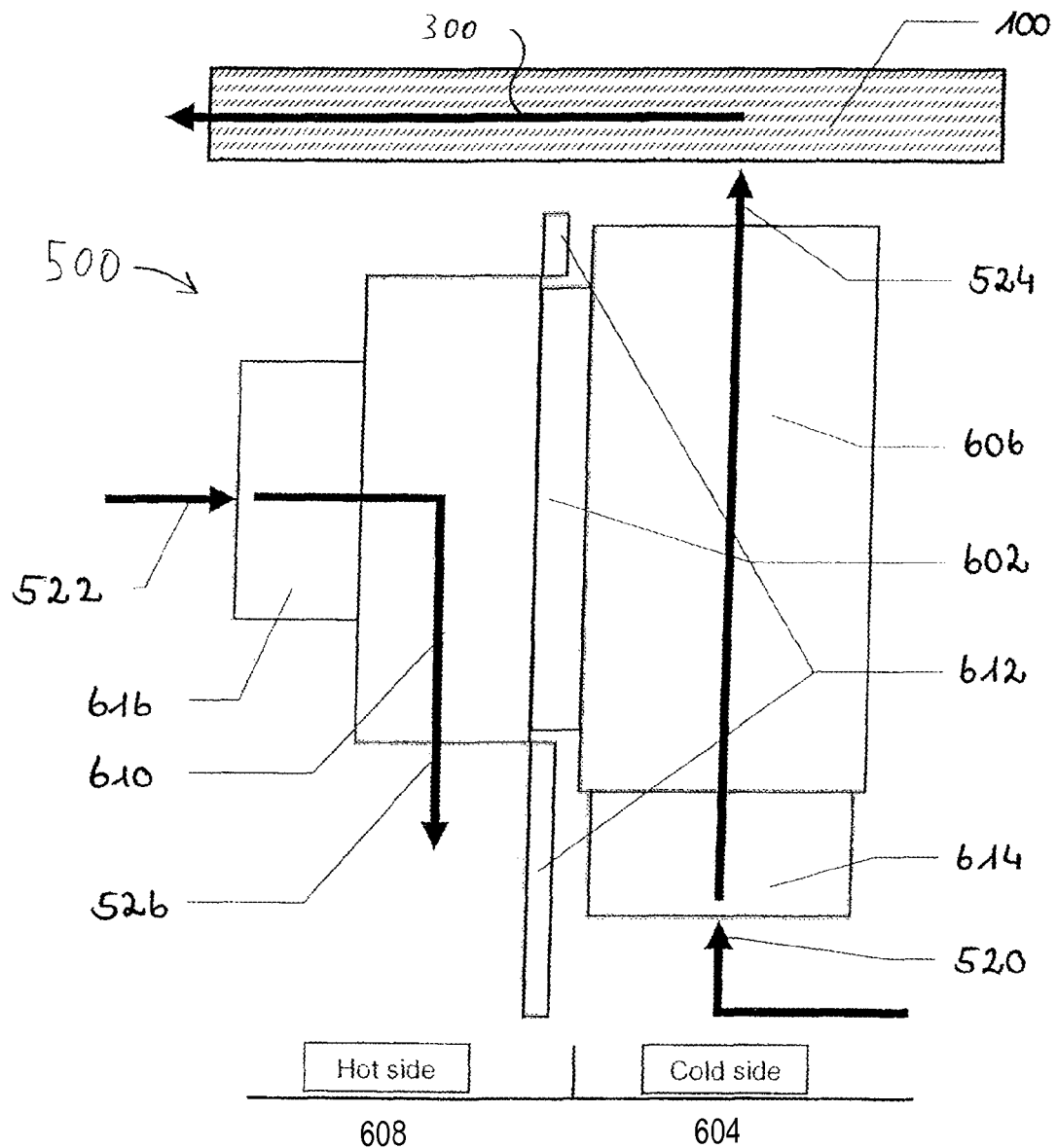
FIG. 6 schematically illustrates airflows through the desktop stand of FIGS. 5a, 5b.

FIG. 6 schematically illustrates the operation of the desktop stand 500 for providing a cooled airflow to the portable device 100. The cooling assembly of the desktop stand 500 comprises a peltier element 602. On a cold side 604 of the peltier element, a cold sink 606 is provided, for example an aluminium sink with internal ribs 530 (see FIG. 5a). On the hot side 608 of the peltier element 602, a hot sink 610 is provided, which may also be an aluminium sink. A thermal insulating plate 612 is provided to separate and insulate the cold side 604 from the hot side 608. Furthermore, the peltier element 602 is attached to the insulating plate 612.

A fan 614 is provided on the cold side in order to generate the airflow 524 with cooled air from the incoming airflow 520. As the cold sink 606 is tubular shaped, it directs the airflow 522 towards the portable device 100. In this way, fan 614, peltier element 602 and cold sink 606 operate to cool down the ambient airflow 520 and direct the resulting cooled airflow 524 towards the device 100. The cooled airflow 524 enters the portable device 100 and cools the interior thereof as airflow 300, as has been described above.

The fan 610 may be a slow turning fan. A further fan 616 may be provided on the hot side 608 of the peltier element 602 in order to actively cool the hot sink 610 with ambient air. The turning speed of one or both of the fans 614 and 616 may each be adjusted by a closed loop control. The fan 614 may have a larger airflow providing capacity than the fans 112 of the portable device 100.

Figure 7:
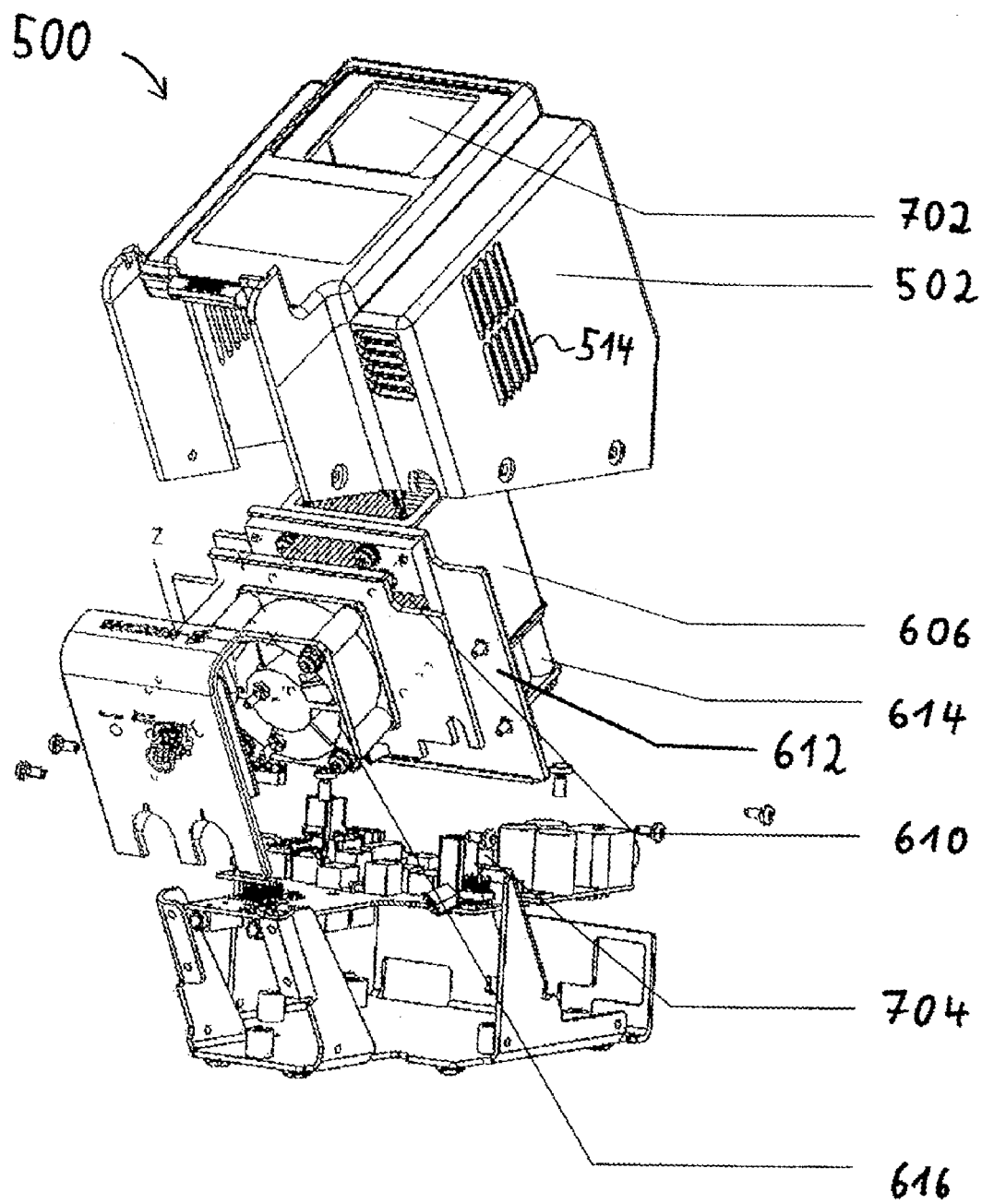
FIG. 7 is an exploded view of the desktop stand of FIGS. 5a-6.

FIG. 7 illustrates some of the elements of the desktop stand 500 in more detail. The housing 502 comprises a cooled air channel 702 for accepting the cold sink 606. Electronic circuitry 704 is provided in a bottom part for controlling the desktop stand 500.

The connectors 508 may be used to sense whether a portable device is received in the recess 504. In case no portable is received or the portable is removed from the desktop stand 500, control logic of the desktop stand 500 may control the stand 500 accordingly. For example, at least one of the fan 614 and the peltier element 602 may be switched off, which leads to reduced power consumption and noise.

In one embodiment, a portable device may comprise a temperature sensor. In case the portable device is received in the recess 504 (see FIG. 5a) of the desktop stand 500, the desktop stand 500 may connect to the temperature sensor in the portable device via the connectors 508 and may in this way determine a portable device temperature from the temperature sensor, wherein the portable device temperature is indicative of an internal temperature of the portable device. Control logic in the desktop stand may control the fan 614 based on the determined portable temperature. For example, the fan 614 may be controlled to be switched off or to rotate with one of multiple speeds depending on the determined portable temperature.

In a variant of this embodiment, additionally or alternatively the peltier element 602 may be controlled depending on the determined portable temperature. For example, the above mentioned control logic may be adapted to control the peltier element 602 such that the peltier element 602 is operative only for portable temperatures above 50 degrees Celsius.

While the desktop stand 500 comprises a peltier element, other techniques may additionally or alternatively be used for generating a cooled airflow. Depending in the operational parameters, in another embodiment of a desktop stand a second fan or airflow generator for cooling a hot side of a peltier element or similar component may be omitted. While in the desktop stand 500 the cooled airflow 524 is directed with the straight tubular-shaped cold sink 606, in other embodiments extra airflow diverting elements may be provided in order to focus an airflow to a portable device received by a desktop stand.

The proposed cooling techniques increase the cooling efficiency for portable devices and provide for an increased internal design flexibility of portable devices such as mobile telephones or any small or size-limited device, in particular those portable devices with a high power consumption.

Providing a heat sink element connected to the multiple electronic components of the device consuming the essential part of the totally consumed power enables dissipation of the thermal energy away from these components to areas inside the device where the air is flowing. Furthermore, the heat sink element distributes this heat on a larger area, enabling a more efficient dissipation to the airflow. Thus the heat sink element increases internal design flexibility with respect to the arrangement of the heat-generating components.

Providing a single heat sink element increases cooling efficiency for compact design, as one and the same part of the heat sink element may serve to cool different heat-generating components; consider for example different operational states of the device with different (or all) of the heat-generating components being active.

The heat sink element may efficiently and reliably connected to the heat-generating components by pressing the element onto the components (e.g., by screwing the heat sink element to the PCB carrying the heat-generating components) and/or using thermal gap filler grease. In order for efficient heat dissipation while minimizing the extra amount of space required, the heat sink element may be dimensioned comparable to the one or more PCBs in the device. Ribs and/or air passages in the heat sink element further increase at least one of cooling efficiency and design flexibility of the portable device.

Air passages such as openings in PCB layers and/or heat sink layers enable that an airflow may reach any of the internal elements in the device and may directly dissipate heat from heat sink members and the heat-generating components itself and may thereby effectively cool these and other, e.g., particularly temperature-sensitive elements. The airflow within the portable device can be optimized according to the specific cooling requirements. Furthermore, the proposed techniques enable that the PCB layer may itself be used as a heat sink for components mounted thereon.

As mentioned above, distribution of air between the one or more PCB layers and/or heat sink layers of a portable device can be adjusted by appropriately choosing the size and/or shape of the air passages. Aligning an air passage with an airflow generator limits the overall air resistance for the fans. Aligning the air passages with particularly temperature-sensitive components such as an LCD or other display component allows efficiently cooling this component. In case an LCD or other front component of the portable device is concerned, arranging the airflow generator at the rearward side of a portable housing in alignment with air passages in the internal PCB layers and/or heatsink layers enables efficient cooling of the front component as well as components supported by the intermediate layers.

By providing appropriate air passages in the PCB layers and/or heat sink layers, an efficient cooling can be achieved regardless of where the heat-generating components are positioned within the portable device. This increases the flexibility in the internal design of the portable device. As the internal airflow may directly reach the internal heat sink, ribs provided at heat sink members may efficiently dissipate thermal energy and may at the same time be used to guide the airflow through the device.

The extra space required by cooling elements such as air passages, airflow generators and heat sinks can be minimized. The PCB assembly area is essentially not reduced. Further, the techniques described herein do not degrade the external design of a portable device.

An external desktop stand further supports the described cooling concepts by providing actively cooled air to the interior of a portable device. An additional, stronger fan in the desktop stand may support the smaller fan provided internally in the portable device by blowing air through the various PCB/heat sink layers and along these layers in the device. The desktop stand may thus enable a permanent usage and/or longer lifetime of the portable device. The external desktop stand may be used to provide at the same time further cooling as described above and an additional power supply for the portable device.

While the current invention has been described in relation to its preferred embodiments, it is to be understood that this description is for illustrative purposes only. Accordingly, it is intended that the invention be limited only by the scope of the claims appended hereto.

The invention claimed is:

1. A portable device, comprising:
one or more printed circuit boards ("PCBs") supporting multiple heat-generating components;
an airflow generator adapted to generate an airflow internally in the portable device; and
a heat sink element thermally connected to the multiple heat-generating components, wherein the heat sink element is adapted to receive heat from the heat-generating components for dissipation by the airflow,
wherein an inflowing direction of the airflow into the portable device is perpendicular to a main area of the heat sink element and an outflowing direction of the airflow is parallel to the main area of the heat sink element; and
wherein the heat sink element is adapted to divert at least a first part of the airflow from a perpendicular to a parallel flow direction with regard to the main area of the heat sink element.

2. The portable device according to claim 1, wherein the heat sink element is thermally connected to the multiple heat-generating components by thermal gap filler grease.

3. The portable device according to claim 1, wherein the heat sink element is an essentially flat element.

4. The portable device according to claim 3, wherein the heat sink element essentially spans over a main area of the portable device.

5. The portable device according to claim 1, wherein the heat sink element comprises ribs for directing the airflow along the heat sink element.

6. The portable device according to claim 1, wherein the heat sink element comprises an air passage adapted to enable passing of at least a second part of the airflow through the heat sink.

7. The portable device according to claim 1, wherein at least one of the at least one PCBs comprises an air passage adapted to enable passing of at least a third part of the airflow through the PCB.

8. The portable device according to claim 1, wherein an inflowing portion of the airflow directly flows to the heat sink element.

9. The portable device according to claim 1, wherein the airflow generator is located at a rearward side of the portable device.

10. The portable device according to claim 1, comprising a housing with laterally arranged air outlets.

11. The portable device according to claim 1, wherein the portable device is a mobile telephone.

12. A portable device, comprising:
a first printed circuit board ("PCB") layer comprising at least one PCB; and
an airflow generator adapted to generate an internal airflow for cooling the portable device,
wherein the first PCB layer comprises an air passage adapted to enable passing of at least a fourth part of the airflow through the first PCB layer, and
wherein the air passage is adapted to enable flowing of at least a portion of the fourth part of the airflow along a first side of the first PCB layer and flowing of a fifth part of the airflow not passing through the air passage along an opposite side of the first PCB layer.

13. The portable device according to claim 12, wherein the airflow generator is provided adjacent to the air passage in the PCB layer.

14. A portable device, comprising:
a first printed circuit board ("PCB") layer comprising at least one PCB; and
an airflow generator adapted to generate an internal airflow for cooling the portable device,
wherein the first PCB layer comprises an air passage adapted to enable passing of at least a fourth part of the airflow through the first PCB layer, and
wherein the portable device further comprises a second PCB layer having an air passage.

15. A portable device, comprising:
a first printed circuit board ("PCB") layer comprising at least one PCB; and
an airflow generator adapted to generate an internal airflow for cooling the portable device,
wherein the first PCB layer comprises an air passage adapted to enable passing of at least a fourth part of the airflow through the first PCB layer,
wherein the air passage is adapted such that at least a portion of the fourth part of the airflow impinges on at least one of a heat-generating component and a temperature-sensitive component of the portable device after passing through the PCB layer.

16. The portable device according to claim 15, wherein the temperature-sensitive component is a display component of the portable device.

17. A portable device, comprising:
a first printed circuit board ("PCB") layer comprising at least one PCB; and
an airflow generator adapted to generate an internal airflow for cooling the portable device, wherein the first PCB layer comprises an air passage adapted to enable passing of at least a fourth part of the airflow through the first PCB layer,
wherein the air passage in the first PCB layer comprises at least one of an opening in a PCB and a gap between two PCBs.

18. The portable device according to claim 14, wherein the airflow generator is arranged in the air passage of at least one of the first and the second PCB layer.

19. A portable device, comprising:
a first printed circuit board ("PCB") layer comprising at least one PCB; and
an airflow generator adapted to generate an internal airflow for cooling the portable device,
wherein the first PCB layer comprises an air passage adapted to enable passing of at least a fourth part of the airflow through the first PCB layer, and
wherein the portable device further comprises a heat sink layer extending substantially parallel to the first PCB layer, the heat sink layer comprising one or more heat sink members adapted to thermally connect to one or more heat generating components of the portable device.

20. The portable device according to claim 19, wherein the heat sink layer comprises an air passage adapted to enable passing of at least a sixth part of the airflow through the heat sink layer.

21. The portable device according to claim 20, wherein the air passage in the heat sink layer and the air passage in the first PCB layer are aligned with each other.

22. The portable device according to claim 19, wherein the one or more heat sink members comprise ribs adapted to cool the heat-generating components and to guide the air flow internally through the portable device.

* * * * *